United States Patent
Lin

(10) Patent No.: US 7,463,539 B2
(45) Date of Patent: Dec. 9, 2008

(54) METHOD FOR BURST MODE, BIT LINE CHARGE TRANSFER AND MEMORY USING THE SAME

(75) Inventor: Yung Feng Lin, Dasi Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/619,062

(22) Filed: Jan. 2, 2007

(65) Prior Publication Data

US 2008/0159032 A1 Jul. 3, 2008

(51) Int. Cl.
*G11C 7/00* (2006.01)
(52) U.S. Cl. ............. 365/203; 365/185.25; 365/189.15; 365/204; 365/233.17; 365/233.18
(58) Field of Classification Search .................. 365/203, 365/185.25, 189.15, 204, 233.17, 233.18
See application file for complete search history.

(56) References Cited

U.S. PATENT DOCUMENTS

| | | | |
|---|---|---|---|
| 6,219,290 B1 | 4/2001 | Chang et al. | |
| 6,392,447 B2 | 5/2002 | Rai et al. | |
| 6,498,751 B2 | 12/2002 | Ordonez et al. | |
| 7,082,061 B2 | 7/2006 | Chou et al. | |
| 2006/0146623 A1* | 7/2006 | Mizuno et al. | 365/203 |
| 2006/0274589 A1* | 12/2006 | Suh | 365/207 |

OTHER PUBLICATIONS

Le et al. "Virtual-Ground Sensing Techniques for a 49-na/200-MHz Access Time 1.9-V 256-Mb 2-Bit-per-Cell Flash Memory," IEEE Journal of Solid-State Circuits, vol. 39, No. 11, 2014-2023.
Pathak et al., "A 1.8V 64Mb 100MHz Flexible Read While Write Flash Memory," 2001 IEEE Int'l Solid-State Circuits Conf. 4 pages.

* cited by examiner

*Primary Examiner*—Amir Zarabian
*Assistant Examiner*—Fernando N Hidalgo
(74) *Attorney, Agent, or Firm*—Haynes Beffel & Wolfeld LLP

(57) ABSTRACT

A memory device operates according to a method for reading includes pre-charging a first set of selected bit lines to a pre-charge voltage and sensing data from the cells coupled to the first set of selected bit lines. Then, residual charge is transferred from the first set of selected bit lines to corresponding members of a second set of selected bit lines. The second set of selected bit lines, having an initial charge transferred from the first set, is then pre-charged to the pre-charge voltage. The data from the cells coupled to the second set of selected bit lines it is then sensed. In embodiments described herein, the read operation occurs in a burst read mode, where a volume of data having consecutive addresses is read.

8 Claims, 6 Drawing Sheets

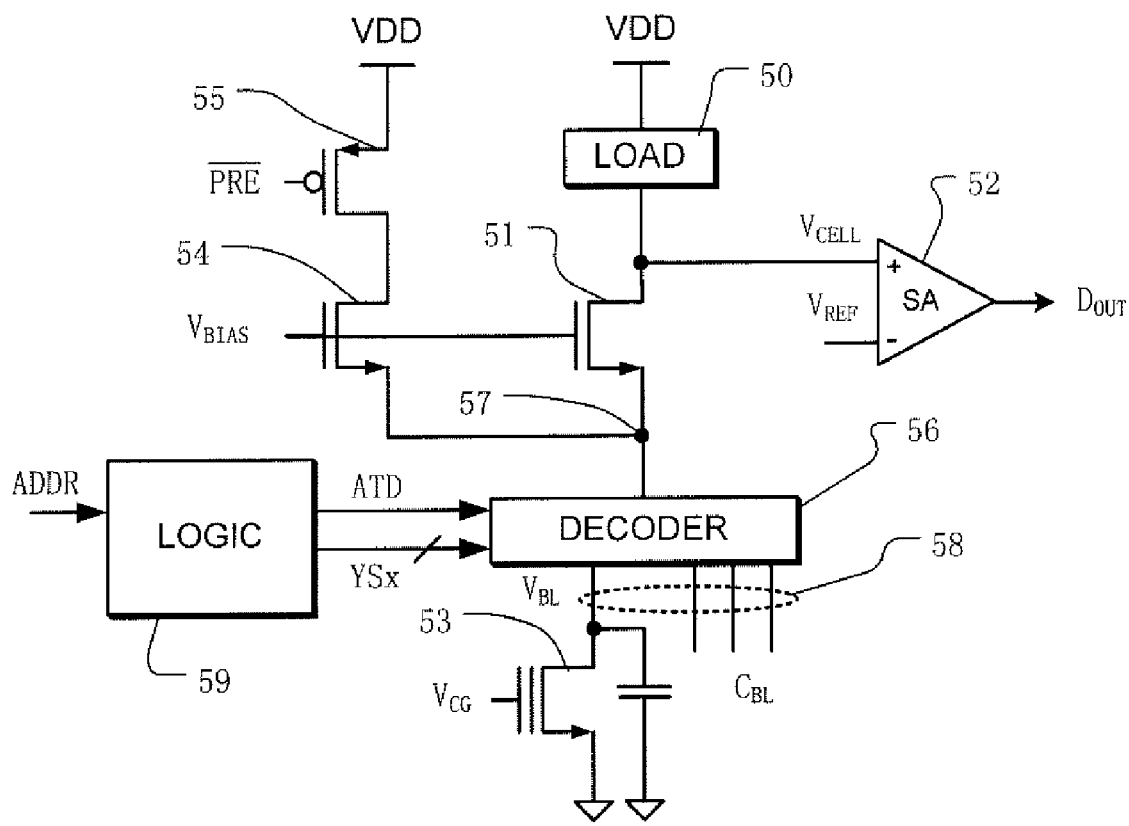
Fig. 2 – PRIOR ART

Fig. 3 – PRIOR ART
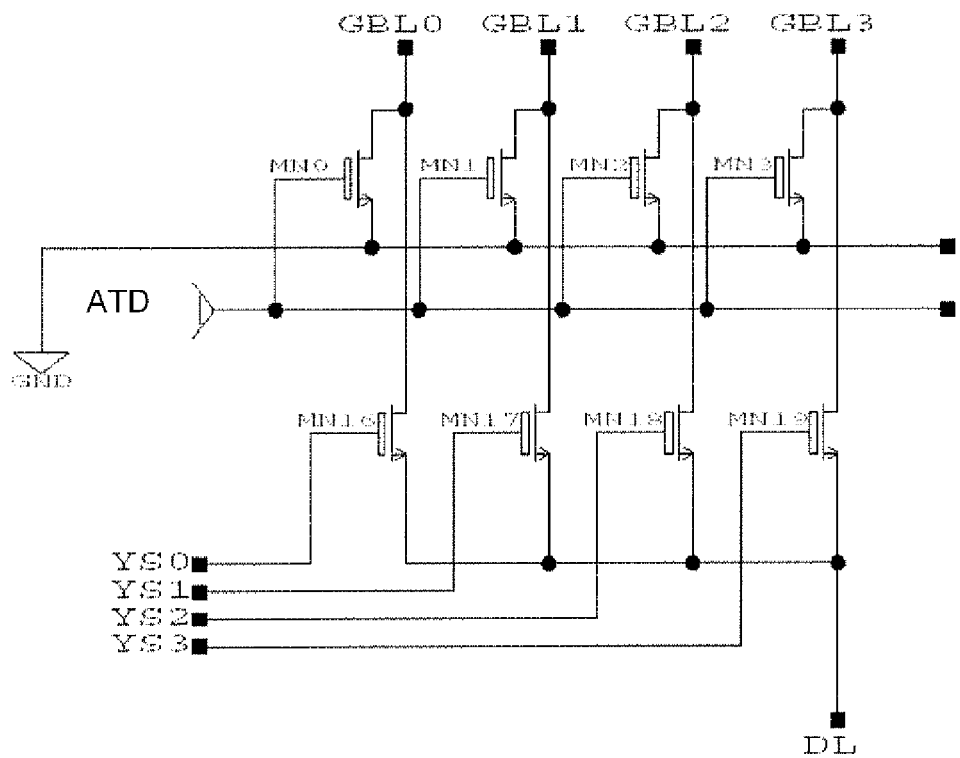
Fig. 4 – PRIOR ART
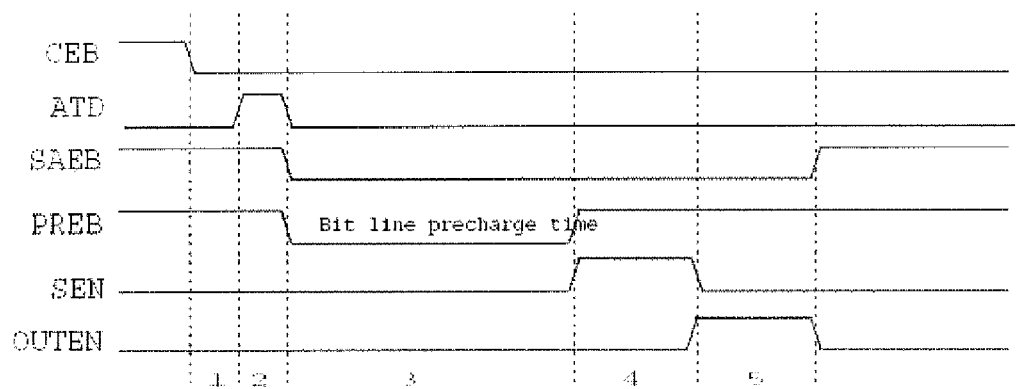

METHOD FOR BURST MODE, BIT LINE CHARGE TRANSFER AND MEMORY USING THE SAME

BACKGROUND OF THE INVENTION

1. Field of the Invention

The present invention relates generally to integrated circuit memory devices, and more specifically to efficient read methods in such devices with reduced power consumption.

2. Description of Related Art

Power consumption in integrated circuit memory devices is a design concern in many applications, including memory for small portable devices that rely on battery power or other sources of limited power, and memory for systems that otherwise require power efficient operation.

One source of power consumption in memory devices during a read operation arises from bit line pre-charge operations, used to set up a bit line for a read. Typical structures used for these purposes are illustrated in U.S. Pat. No. 6,219,290, entitled MEMORY CELL SENSE AMPLIFIER, invented by Chang et al.; U.S. Pat. No. 6,498,751, entitled FAST SENSE AMPLIFIER FOR NONVOLATILE MEMORIES, invented by Ordonez, et al.; U.S. Pat. No. 6,392,447, entitled SENSE AMPLIFIER WITH IMPROVED SENSITIVITY, invented by Rai et al.; and U.S. Pat. No. 7,082,061, entitled MEMORY ARRAY WITH LOW POWER BIT LINE PRE-CHARGE, invented by Chou et al.

Basically the set up procedures in the prior art seek to first discharge the bit lines in an array to a common voltage such as ground, and then pre-charge selected bit lines for a read operation. Since the bit lines have relatively large capacitance, the pre-charging and discharging operations can require significant current, and substantial power to produce the current. When a large number of bit lines are being operated in parallel, such as in modern devices that include 64 or more parallel sense amplifiers, the power needed to generate this current can be even more significant.

It is desirable therefore to provide read methods and systems that conserve power during read operations.

SUMMARY OF THE INVENTION

In large scale integrated circuit memory devices having modes of operation, such as burst read modes, in which a predictable sequence of bit line decoding is executed during a read cycle, charge from a previously sensed bit line is transferred to a bit line to be sensed next, and re-used. The amount of charge on a previously sensed bit line which can be transferred to a next bit line directly reduces the amount of power needed for pre-charging the next bit line. Thus, the present invention provides for reusing charge during read sequences, and particularly in such sequences that have predictable bit line decoding patterns.

A method for operating a memory device as described herein for reading the data includes pre-charging a first set of selected bit lines to a pre-charge voltage, and sensing data from the cells coupled to the first set of selected bit lines. Then, residual charge is transferred from the first set of selected bit lines to corresponding members of a second set of selected bit lines. During this interval, typically other bit lines on the integrated circuit are discharged to ground, or to another reference potential. The second set of selected bit lines, having an initial charge transferred from the first set, is then pre-charged to the pre-charge voltage. The data from the cells coupled to the second set of selected bit lines is then sensed. In embodiments described herein, the read operation occurs in a burst read mode, where a volume of data having consecutive addresses is read. For a burst read mode, for example, a plurality of iterations including sensing data, transferring residual charge to a next bit line, and pre-charging the next bit line, is executed until the addressed block is completely read. In burst read mode operation or other similar read sequences, the address of the second set of selected bit lines is easily predicted. Relatively simple hardware circuitry can be provided on the integrated circuit and enabled during a burst read mode, to implement the charge transfer efficiently and without substantially impacting the speed of the read sequence.

The technology described is embodied in integrated circuit memory including an array of memory cells, such as flash memory, read only memory or other memory cell technology. An array of memory cells includes a large number of bit lines. The bit lines are coupled to column decoding circuitry which includes a set of decoders operable to selectively connect one bit line in a corresponding plurality of bit lines, such as 4 or 8 bit lines from the array, having some common address bits, to a respective data line which is in turn coupled to a sense amplifier. In an embodiment described herein, circuitry for executing the charge transfer is associated with the decoders. Circuitry for executing the pre-charge is coupled to the data lines. Control logic is used to generate a first signal which enables charge transfer between a first bit line and second bit line in the plurality of bit lines coupled to the same decoder and data line, followed by a second signal which enables the pre-charging of the second bit line after it is coupled to the data line. The control logic is responsive, for example, to the detection of a transition in the address signal to issue the first and second signals in sequence.

The technology described herein is particularly suitable to integrated circuits supporting burst read mode operation and page mode operation, where a large number of sense amplifiers are arranged in parallel for page mode operation. In these types of devices, the amount of power savings is amplified by the large number of sense amplifiers and bit lines operated in parallel.

Other aspects of the technology described herein can be seen on review of the drawings, the detailed description and the claims which follow.

BRIEF DESCRIPTION OF THE DRAWINGS

FIG. 2 illustrates in prior art bit line pre-charging circuitry.

FIG. 3 illustrates bit line discharging circuitry utilized in prior art column decoding circuits.

FIG. 4 is a timing diagram used for explanation of the operation of the prior art circuitry in FIG. 3.

DETAILED DESCRIPTION

The following detailed description is made with reference to the figures. Preferred embodiments are described to illustrate the present invention, not to limit its scope, which is defined solely by the claims. Those of ordinary skill in the art will recognize a variety of equivalent variations on the description that follows.

Figure 1:
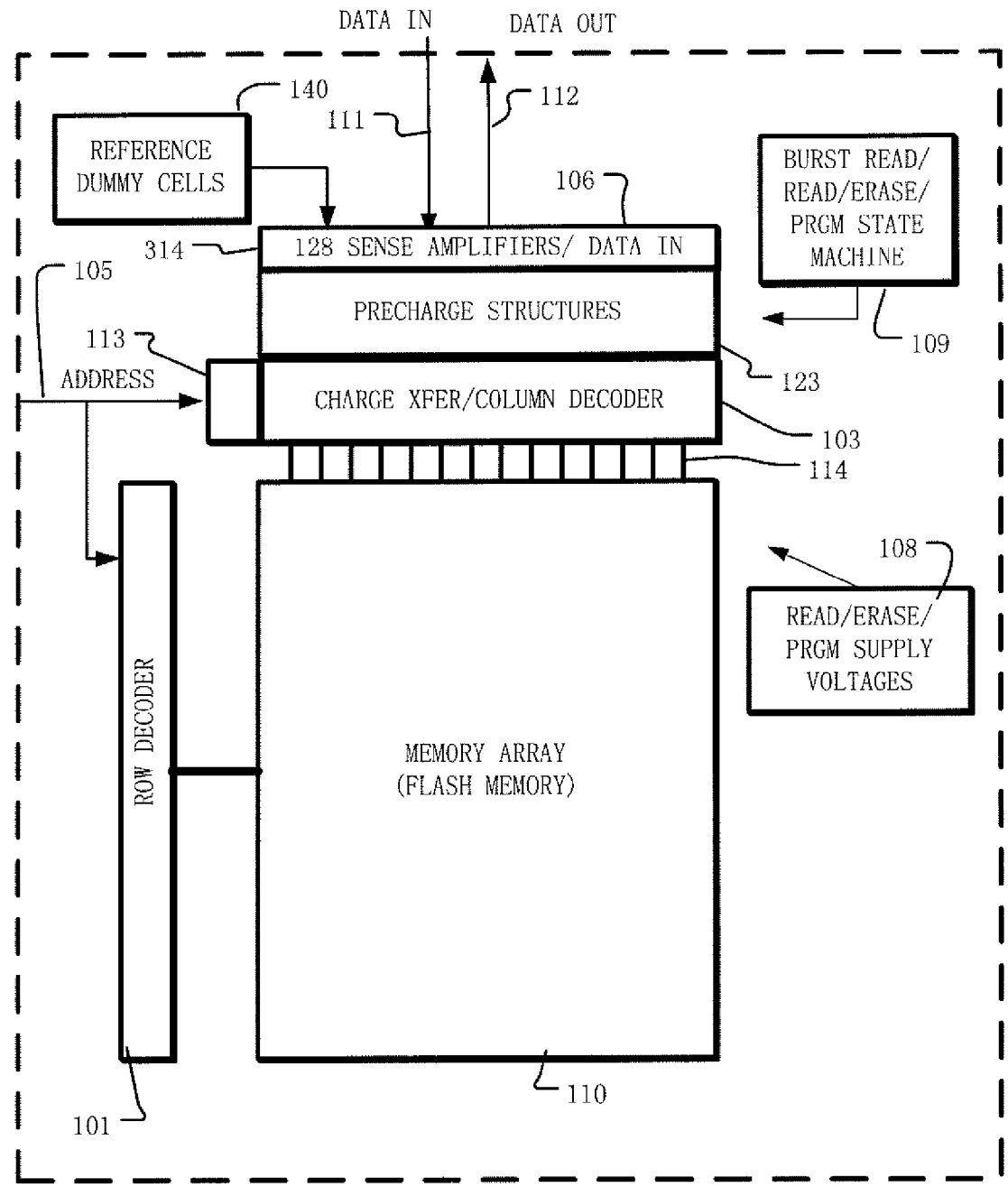
FIG. 1 is a simplified block diagram of an integrated circuit memory device including the charge transfer technology described herein.

FIG. 1 is a simplified block diagram of an integrated circuit memory with a burst read mode, and including pre-charge and charge transferring circuitry to support reuse of charge used for sensing as described herein. The integrated circuit includes a memory array 110 implemented using memory cells, such as floating gate or charge trapping non-volatile memory cells flash memory. Read only memory cells or other types of memory cells can also be used in embodiments of the technology. A page/row decoder 101 is coupled to a plurality of word lines arranged along rows in the memory array 110. A column decoder 103, with charge transfer circuitry, is coupled to a plurality of global bit line conductors 114 arranged along columns of memory cells in the memory array 110. Data line load and pre-charge circuits 123 are coupled to the columns of memory cells in the memory array via data lines (not shown), the column decoder 103 and global bit line conductors 114. Addresses are supplied on bus 105 to column decoder 103 (via pre-decoding and control signal logic circuitry 113) and page/row decoder 101. Sense amplifiers and data-in structures in block 106 are coupled to the data lines that are coupled via the column decoder 103 and a selected global bit line, and to selected memory columns of memory cells. The global bit lines are coupled with local bit lines as is typical in the art, and the memory cells are connected to the local bit lines. A plurality of reference dummy cells 140 is included on the integrated circuit, and used for generating reference voltage for use by the sense amplifiers in the block 106, so that the reference voltage used by the sense amplifiers in the block 106 tracks changes in threshold of the actual memory cells in the memory array 110. Data is supplied via the data-in line 111 from input/output ports on the integrated circuit to the data-in structures in block 106. Data is supplied via the data-out line 112 from the sense amplifiers in block 106 to input/output ports on the integrated circuit. In embodiments of the present technology, a large number of sense amplifiers with corresponding data lines is utilized. In the illustrated embodiment, 128 sense amplifiers are arranged for page mode operation. Even larger numbers of sense amplifiers can be implemented as suits a particular implication. In memory arrays with global bit lines, each global bit line is coupled to a plurality of local bit lines, either directly or through a switch which isolates the local bit lines not connected to a selected memory cell from the global bit line during operations of the device. Typically, although not necessarily, the global bit lines are implemented using a metal line that extends along a column that includes a large number of memory cells. In contrast, a local bit line may be connected to a smaller number of memory cells, such as 64 or 32 memory cells per local bit line. In some embodiments, the global bit line/local bit line structures are not utilized, so that a single bit line lies along a given column of memory cells.

Resources for controlling the reading, including burst read operations, programming and erasing of memory cells in the array 110 are included on the chip. These resources include read/erase/program supply voltage sources represented by block 108, and the state machine 109, which are coupled to the array 110, the decoders 101, 103 and other circuitry on the integrated circuit, which participate in operation of the device. The state machine 109 controls the timing of the sense amplifiers, pre-charge circuits, column decoders and charge transfer circuits of the data path on the memory in order to conserve power as described in more detail below.

The supply voltage sources (block 108) are implemented in various embodiments using charge pumps, voltage regulators, voltage dividers and the like as known in the art, for supplying various voltage levels, including negative voltages, used in the read, erase and program operations.

The state machine 109 supports read, burst read, page read, erase and program operations. The state machine 109 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

FIG. 2 shows an example of a prior art pre-charging and sensing arrangement. As illustrated, one of a plurality of bit lines 58 is coupled between a selected memory cell 53 and a data line 57 by decoder 56. The clamp transistor 51 on the bit line is connected to the sensing node $V_{CELL}$. A load 50 (such as a diode connected transistor), is connected between the sensing node $V_{CELL}$ and a supply potential VDD. Sense amplifier 52 is coupled to the sensing node $V_{CELL}$ and a reference voltage $V_{REF}$, provided from a dummy cell or otherwise. The gate of the clamp transistor 51 is connected to bias voltage $V_{BIAS}$. In an alternative system, a dynamic feedback inverter is used to bias the gate of the clamp transistor 51. Additional pre-charge current is provided through transistor 54 and transistor 55. Transistor 54 is an n-channel MOS transistor having its source coupled to the source of clamp transistor 51, and its gate coupled to the gate of clamp transistor 51 so that it receives the same bias voltage $V_{BIAS}$ (or the same output of the feedback inverter). Transistor 55 is a p-channel MOS transistor having its drain coupled to the drain of transistor 54, its source coupled to a pre-charge supply voltage, which is typically, although not necessarily, the same supply voltage as the load supply voltage VDD. The gate of the transistor 55 is controlled by a logic signal PRE, which enables pre-charging when it is at a low level, by turning on transistor 55 into saturation with consequently very little voltage drop across it. Transistor 54 is a transistor having a higher threshold voltage than the clamp transistor 51. The higher threshold is achieved for example by making transistor 54 with a narrower and longer channel region. Therefore, during a pre-charge interval, pre-charge paths are provided both through the load 50 and the transistor 55 to a selected bit line via the decoder 56. Both transistors 54 and 51 will be on while the voltage $V_{BL}$ on the selected bit line s low. As the voltage on the bit line $V_{BL}$ approaches $V_{BIAS}$ (less the threshold of transistor 54, including body effects), transistor 54 will turn off first because of its higher threshold voltage, and disable the pre-charge path through transistor 55. Dynamic balance will be achieved between the load 50 and the clamp transistor 51 as described above, settling the sensing node at the target level. Because the path through transistor 55 is enabled during the first part of the pre-charge operation, more current is applied to charging up the bit line capacitance $C_{BL}$, and the voltage on the bit line $V_{BL}$ rises more quickly. Thus, the sensing system settles on the target voltage more quickly. With a shorter pre-charge interval, faster sensing can be achieved.

FIG. 3 illustrates an embodiment of a prior art decoder and discharging circuit, such as might be used in the circuitry of FIG. 2. The figure illustrates four global bit lines GBL0, GBL1, GBL2, GBL3. N-channel transistors MN0-MN3 are connected between ground and respective global bit lines GBL0, GBL1, GBL2, GBL3. The gates of the transistors MN0-MN3 are connected to a control signal ATD, and operable to the couple of all the bit lines in the group to ground in parallel. N-channel transistors MN16-MN19 are connected between the data line DL and respective global bit lines GBL0, GBL1, GBL2, GBL3. The gates of the transistors MN16-MN19 are connected to respective decoded address signals YS0, YS1, YS2, YS3, operable to select one of the bit lines for connection to the data line DL. The data line DL is in turn coupled to a sense amplifier and pre-charge circuitry as described above with reference to FIG. 2.

FIG. 4 shows a timing diagram for operation of the circuitry of FIG. 3, in an integrated circuit that is responsive to a chip enable signal (active low) CEB, an address transition signal ATD generated as known in the art upon changes in an input address, a sense amplifier enable signal (active low) SAEB, a pre-charge signal (active low) PREB, a sensing signal SEN during which the sense amplifier is operated to sense the data on the data line, and an output enable signal OUTEN during which data is provided as output from the sense amplifier. As can be seen by reference to FIG. 4, a typical prior art device asserts the sense amplifier enable signal SAEB and pre-charge signal PREB in response to an address transition detection signal ATD. During the address transition detection signal ATD, the decoded address signals operate to connect a selected global bit line to the data line DL. The selected global bit line is pre-charged during the interval between assertion of the sense amplifier enable signal SAEB, and the sensing signal SEN. Output data is applied after the sensing signal SEN.

Figure 5:
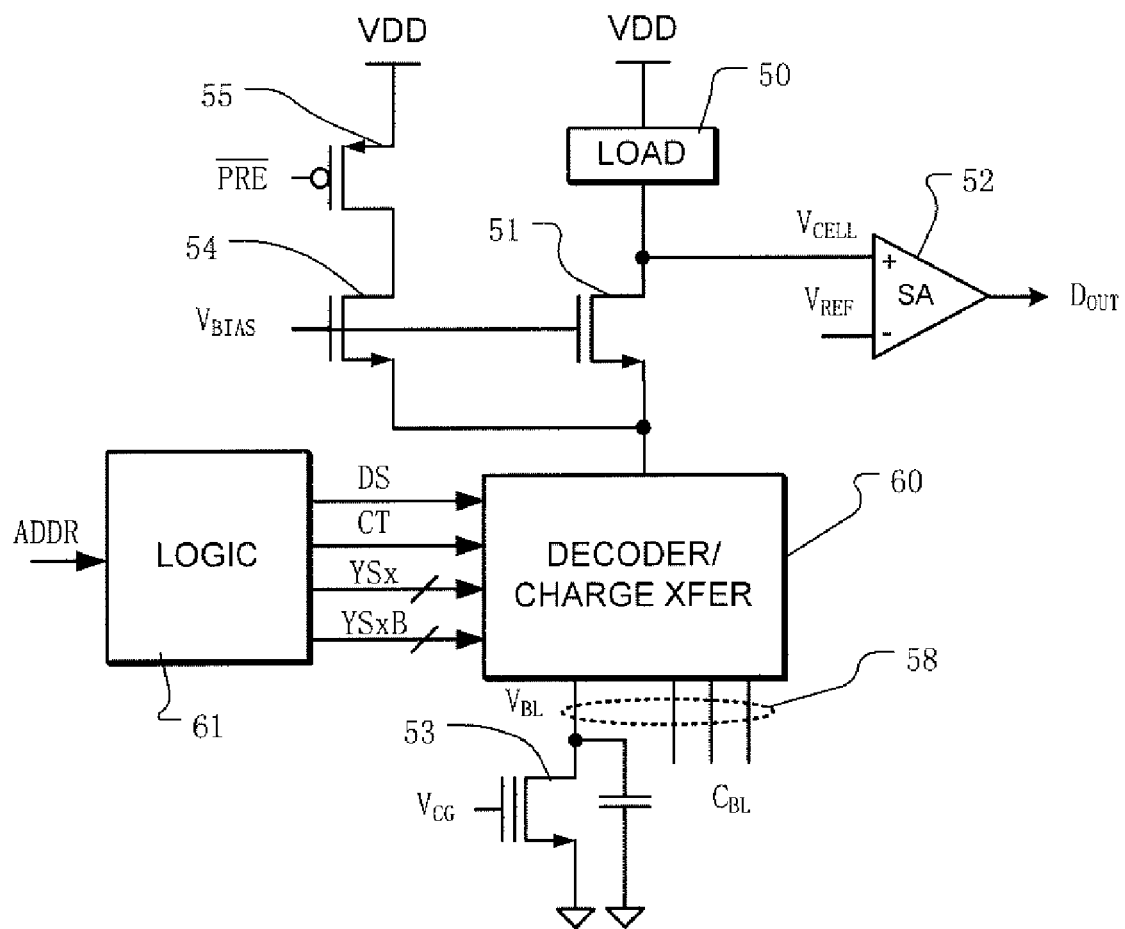
FIG. 5 illustrates bit line pre-charging and charge transfer circuitry according to the present invention.

FIG. 5 illustrates in simplified form, a modification of the circuitry of FIG. 2 according to techniques described herein for charge sharing among bit lines 58. The reference numerals used on FIG. 2 are repeated in FIG. 5 for like components, and such components are not re-described. In FIG. 5, the decoder 56 of the prior art device in FIG. 2, is replaced with the decoder/charge transfer circuitry 60. Also, the logic 56 of the prior art device in FIG. 2, is replaced with the logic 61 to support the decoder/charge transfer circuitry 60. The circuitry in FIG. 5 is repeated across the memory array to provide a plurality of decoder/transfer/pre-charge/sense sets that are operated in parallel. Each decoder/transfer/pre-charge/sense set is associated with a corresponding plurality of bit lines (e.g. 4 bit lines) that share common address bits.

Figure 6:
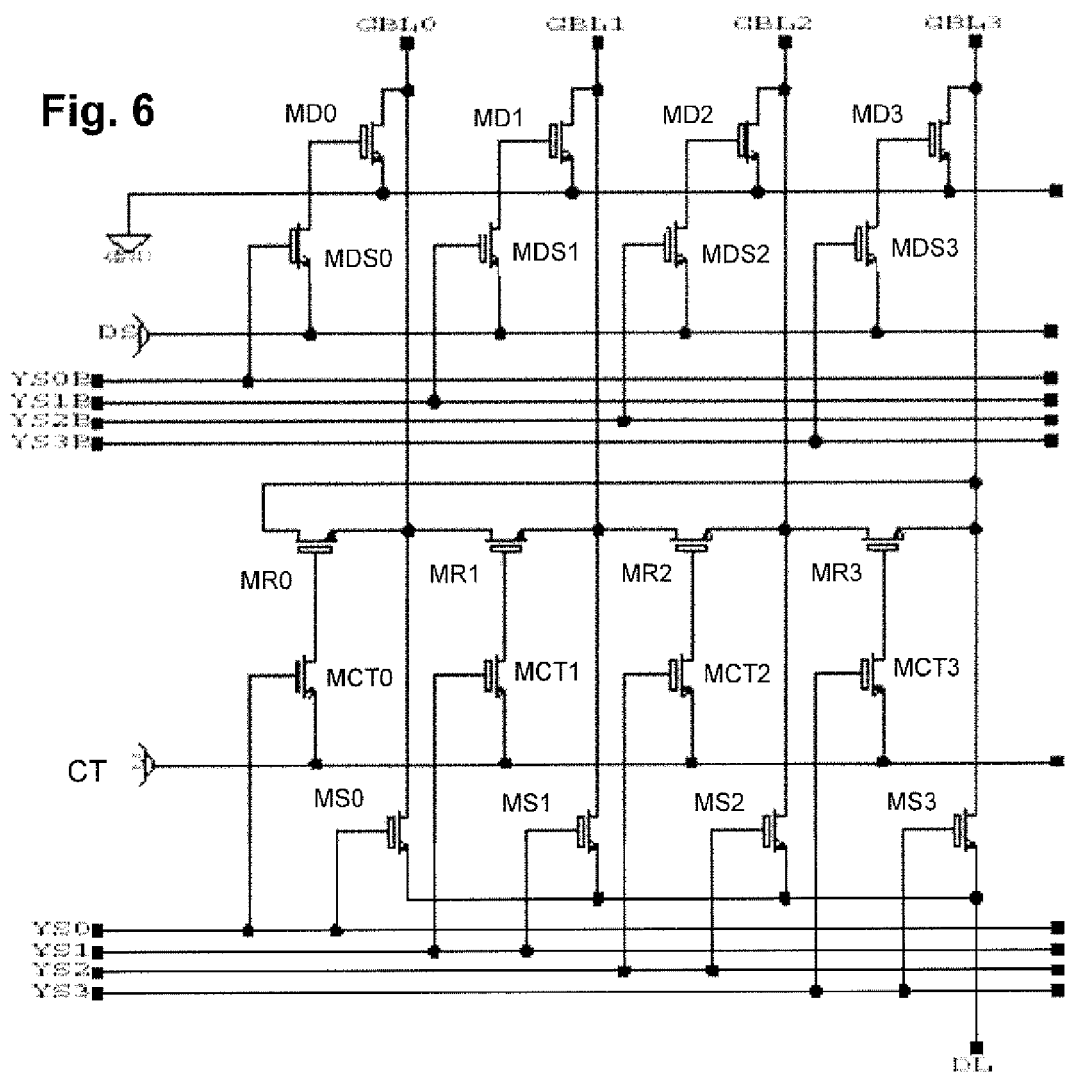
FIG. 6 is a circuit diagram illustrating bit line discharge circuitry, charge transfer circuitry and column decoding circuitry according to an embodiment of the charged sharing technology described herein.

FIG. 6 illustrates an embodiment of the decoder/charge transfer circuitry 60. FIG. 6 illustrates four global bit lines GBL0, GBL1, GBL2, GBL3. N-channel transistors MD0-MD3 are connected between ground and respective global bit lines GBL0, GBL1, GBL2, GBL3. The gates of the transistors MD0-MD3 are connected to the drains of respective transistors MDS0-MDS3. The sources of the transistors MDS0-MDS3 are coupled to the control line receiving the discharge control signal DS. The gates of the transistors MDS0-MDS3 are coupled to respective decoded address signals YS0B, YS1B, YS2B, YS3B, operable to select the bit lines, as described in more detail below, for connection to ground during the assertion of the discharge control signal DS.

Charge transfer between the global bit lines GBL0, GBL1, GBL2, GBL3 is accomplished using the transistors MR0-MR3, which are connected between respective pairs of global bit lines. Thus, transistor MR0 is connected between global bit line GBL3 and global bit line GBL0. Transistor MR1 is connected between global bit line GBL0 and global bit line GBL1. Transistor MR2 is connected between global bit line GBL1 and global bit line GBL2. Transistor MR3 is connected between global bit line GBL2 and global bit line GBL3. The gates of the transistors MR0-MR3 are connected to the drains of respective transistors MCT0-MCT3. The sources of the transistors MCT0-MCT3 are coupled to the control line receiving the discharge control signal DS. The gates of the transistors MCT0-MCT3 are coupled to respective decoded address signals YS0, YS1, YS2, YS3, operable to select the bit lines, as described in more detail below, for charge sharing during the assertion of the charge transfer control signal CT. The decoded address signals YS0, YS1, YS2 YS3 and YS0B, YS1B, YS2B, YS3B, are true and complement outputs of the same decoding circuitry, as shown in FIG. 8.

N-channel transistors MS0-MS3 are connected between the data line DL and respective global bit lines GBL0, GBL1, GBL2, GBL3. The gates of the transistors MS0-MS3 are connected to respective decoded address signals YS0, YS1, YS2, YS3, operable to select one of the bit lines for connection to the data line DL. The data line DL is in turn coupled to a sense amplifier and pre-charge circuitry as described above. In the circuit example shown, a set of 4 global bit lines, which share 2 common address bits, are coupled to each decoder/charge transfer circuit. In other embodiments, other numbers of global bit lines, including more than 4 global bit lines may be included in each set.

Figure 7:
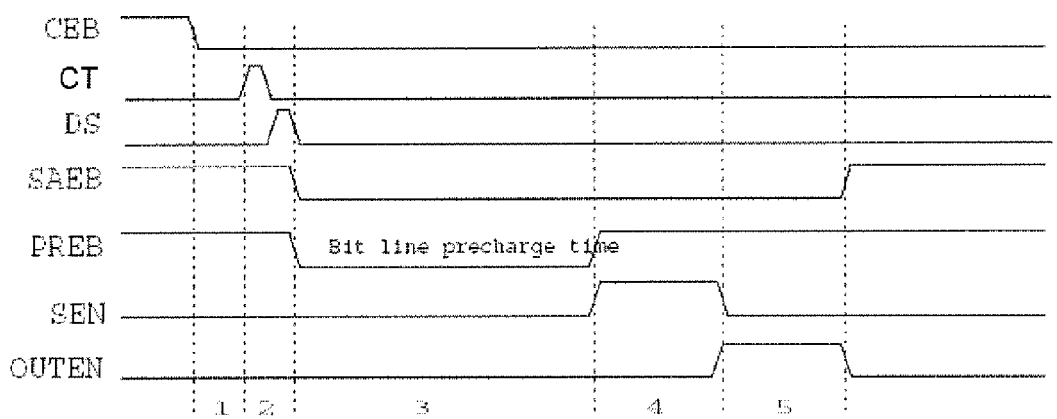
FIG. 7 is a timing diagram used for explanation of the operation of the circuitry in FIG. 6.

FIG. 7 shows a timing diagram for operation of the circuitry of FIG. 6, in an integrated circuit that is responsive to a chip enable signal (active low) CEB, a sense amplifier enable signal (active low) SAEB, a pre-charge signal (active low) PREB, a sensing signal SEN during which the sense amplifier is operated to sense the data on the data line, and an output enable signal OUTEN during which data is provided as output from the sense amplifier. Like the circuitry shown in FIG. 4, a device asserts the sense amplifier enable signal SAEB and pre-charge signal PREB in response to an address transition detection signal ATD. During an interval coinciding with the address transition detection, control logic asserts the charge transfer control signal CT followed by the discharge control signal DS. The charge transfer control signal CT and the discharge control signal DS are implemented for this circuitry by short pulses that have a pulse width that is about half the width of a typical address transition detection signal ATD, like that shown in FIG. 4. The decoded address signals YS0, YS1, YS2, YS3 operate to connect a selected global bit line to the data line DL after the assertion of the discharge control signal DS. The selected global bit line is pre-charged during the interval between assertion of the sense amplifier enable signal SAEB, and the sensing signal SEN. Output data is applied after the sensing signal SEN.

Figure 8:
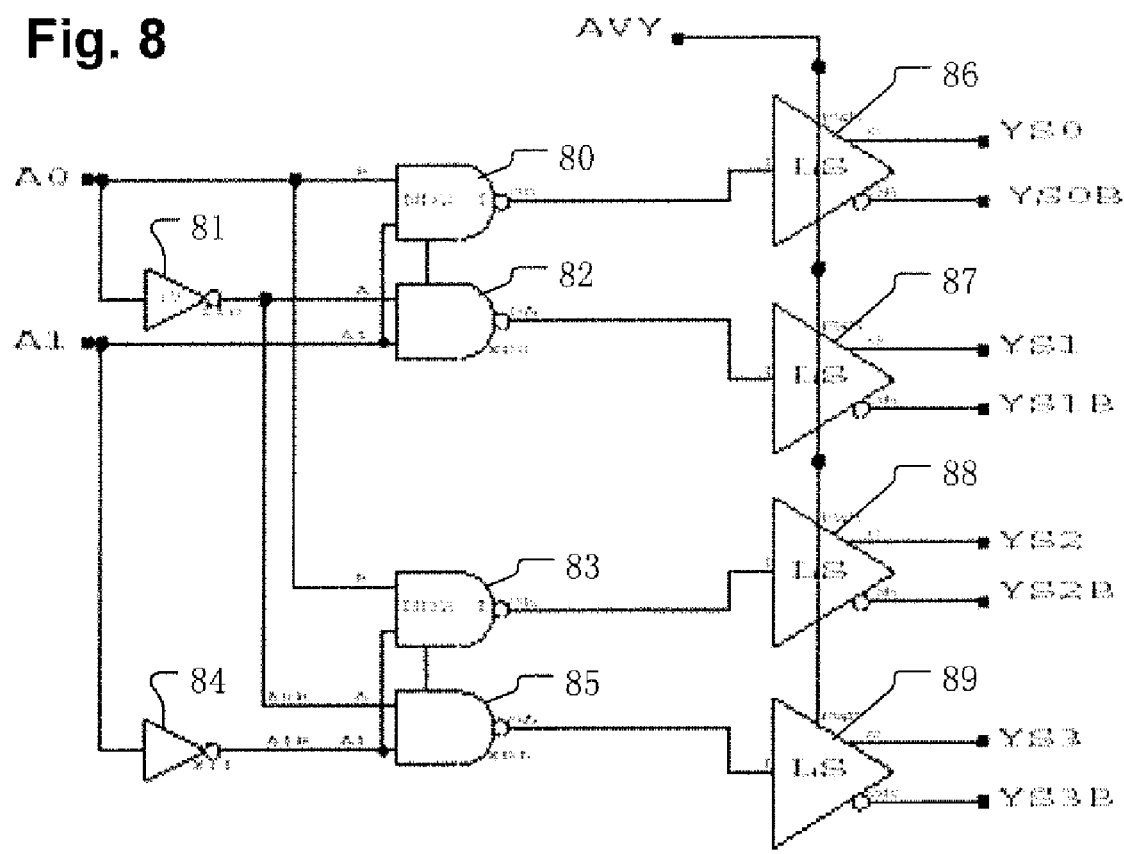
FIG. 8 illustrates decoding circuitry used for producing the column select signals used in the circuitry of FIG. 6.

FIG. 8 illustrates circuitry used for generation of the decoded address signals YS0, YS1, YS2 YS3 and YS0B, YS1B, YS2B, YS3B, applied in the circuit of FIG. 6. Common address bits A0 and A1 are used to identify one of a plurality of global bit lines that are coupled to a decoding circuitry as shown in FIG. 6. Bit A0 is applied as an input to NAND gate 80, as an input to inverter 81 and as an input to NAND gate 83. The output of inverter 81 is connected as an input to the NAND gate 82, and as an input to the NAND gate 85. Address bit A1 is connected as an input to both NAND gates 82 and 80, and as an input to inverter 84. The output of the inverter 84 is connected as an input to both NAND gates 83 and 85. The output of NAND gate 80 is applied as an input to buffer 86, which produces true and complement outputs used as the decoded address signals YS0 and YS0B. The output of NAND gate 82 is applied as an input to buffer 87, which produces true and complement outputs used as the decoded address signals YS1 and YS1B. The output of NAND gate 83 is applied as an input to buffer 88, which produces true and complement outputs used as the decoded address signals YS2 and YS2B. The output of NAND gate 85 is applied as an input to buffer 89, which produces true and complement outputs used as the decoded address signals YS3 and YS3B. A power supply voltage AVY is applied to the buffers 86-89 as shown.

The operation of the circuitry of FIG. 6 can be understood with reference to an example. For example, if the global bit line GBL0 is read, then it will have a residual charge after the sensing operation on the global bit line. During a burst read mode, the next bit line to be sensed can be predicted to be global bit line GBL1. The circuitry of FIG. 6 makes it possible to reuse the residual charge on the previously sensed global bit line GBL0, during pre-charging of the next global bit line GBL1. Thus, control logic to generate the charge transfer control signal CT followed by the discharge control signal DS is enabled during a burst mode. The charge transfer control signal CT in combination with the decoded address signals YS0-YS3 which will select global bit line GBL1 for sensing, is pulsed while the decoded address signal YS1 is high. This causes the transistor MR1, connected between the previously sensed global bit line GBL0 and the next global bit line GBL1 to be sensed, to be turned on. Charge on the global bit line GBL0 is transferred through transistor MR1 to global bit line GBL1. Next, during assertion of the discharge control signal DS, the transistors MDS0 and MDS3 are controlled by the decoded address signals YS0B-YS3B. When selecting global bit line GBL1 for sensing, YS0B, YS2B and YS3B are high and YS1B is low. This causes the global bit lines GBL0, GBL2 and GBL3 to be discharged to ground during the assertion of the discharge control signal DS. The global bit line GBL1 remains isolated from ground during the assertion of the discharge control signal DS, and maintains the charge that it received from global bit line GBL0 during the assertion of the charge transfer control signal CT.

The global bit line GBL0 will contain a residual potential from a previous read cycle. (The statement is not true because SA will try to maintain the drain bias through M54 in FIG. 5 by clamp drain bias to Vbias-Vth(M51), therefore SA will need to provide and sense cell current. By the help of M51, current to voltage will make Icell to Vcell on FIG. 5. So it is possible to conduct current during the previous read cycle) The charge transfer will result in a portion of the residual charge being transferred to the next global bit line GBL1. The amount of the portion that is transferred depends on the relative capacitances of the global bit lines and on other factors that can affect the speed of the charge transfer. However, any substantial amount of charge transfer reduces the amount of charge needed to bring the next global bit line GBL1 up to the pre-charge potential, and conserves power.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating memory device for a read operation, the memory device including an array of memory cells with bit lines selectively connectable to sense amplifiers, the method comprising:
   pre-charging a first set of selected bit lines to a pre-charge voltage and coupling the first set of selected bit lines to a set of sense amplifiers;
   sensing data from cells coupled to the first set of selected bit lines;
   transferring charge from the first set of selected bit lines to corresponding members of a second set of bit lines in response to address signals;
   discharging charged bit lines other than the second set of bit lines in response to said address signals;
   after said transferring charge and said discharging, pre-charging the second set of bit lines to the pre-charge voltage and coupling the second set of selected bit lines to said set of sense amplifiers in response to said address signals; and
   sensing data from cells coupled to the second set of bit lines.

2. The method of claim 1 including, prior to said transferring, predicting the second set of selected bit lines in response to said address signals.

3. The method of claim 1, including executing a plurality of additional iterations until sensing of a block of memory cells is completed, wherein the second set of bit lines in a first additional iteration is a previously sensed set, the iterations including:
   transferring charge from the previously sensed set of selected bit lines to corresponding members of a next set of selected bit lines;
   pre-charging the next set of selected bit lines to the pre-charge voltage; and
   sensing data from cells coupled to the next set of selected bit lines.

4. An integrated circuit memory, comprising:
   an array of memory cells with bit lines coupled to memory cells in columns of the array;
   a column decoder coupled to a plurality of the bit lines in the array that connects selected bit lines from the plurality to a data line in response to an address;
   a pre-charge circuit coupled to the data line, which drives selected bit lines to a pre-charge voltage;
   a sense amplifier coupled to the data line, which senses a data value from a memory cell coupled to a first selected bit line after the first selected bit line has been driven to the pre-charge voltage by the pre-charge circuit, leaving residual charge on the first selected bit line;
   charge transfer circuits, coupled to the plurality of the bit lines in the array, which operate in response to said address to connect the first selected bit line having residual charge to a second selected bit line in the plurality of the bit lines to transfer at least some of the residual charge from the first selected bit line to the second selected bit line; and
   discharge circuits, coupled to the plurality of the bit lines in the array, which operate in response to said address to discharge the bit lines in the plurality of the bit lines except the second selected bit line, to a reference voltage, after the residual charge is transferred to the second selected bit line.

5. The integrated circuit of claim 4, including control circuits to control timing of operation of the pre-charge circuits, the sense amplifier and the charge transfer circuits.

6. An integrated circuit memory, comprising:
   an array of memory cells with bit lines coupled to memory cells in columns of the array; a set of column decoders, column decoders in the set being coupled to a corresponding plurality of the bit lines in the array and operable in parallel to connect selected bit lines from the corresponding plurality to a corresponding data line in response to addresses;
   a set of pre-charge circuits, pre-charge circuits in the set coupled to respective data lines, and operable in parallel to drive selected bit lines from the corresponding plurality of the bit lines to a pre-charge voltage;
   a set of sense amplifiers, sense amplifiers in the set coupled to respective data lines, operable in parallel to sense data values from memory cells coupled to corresponding first selected bit lines from the corresponding plurality of bit lines, after the corresponding first selected bit line has been driven to the pre-charge voltage by the corresponding pre-charge circuit, and leaving residual charge on the corresponding first selected bit line;

a set of charge transfer circuits, coupled to the corresponding plurality of the bit lines in the array, which operate in response to said addresses to connect the corresponding first selected bit line having residual charge to a corresponding second selected bit line in the plurality of the bit lines to transfer at least some of the residual charge from the corresponding first selected bit line to the corresponding second selected bit line; and a set of discharge circuits, discharge circuits in the set coupled to the corresponding plurality of the bit lines in the array, and operable in response to said addresses in parallel to discharge the bit lines in the corresponding plurality of the bit lines, except the corresponding second selected bit line, to a reference voltage, after the residual charge is transferred to the corresponding second selected bit line.

7. The integrated circuit of claim 6, including control circuits to control timing of operation of the set of pre-charge circuits, of the set of sense amplifiers and of the set of charge transfer circuits.

8. The integrated circuit of claim 6, including control logic to generate a first signal which enables charge transfer between the first and second selected bit lines, followed by a second signal which enables the pre-charging of the second selected bit line after it is coupled to the data line.

* * * * *